United States Patent [19]

Ide et al.

[11] 4,456,840
[45] Jun. 26, 1984

[54] COMPARATOR CIRCUIT

[75] Inventors: Tetsuo Ide; Hiromu Iwamoto, both of Yokohama, Japan

[73] Assignee: Fujitsu Limited, Kawasaki, Japan

[21] Appl. No.: 329,947

[22] Filed: Dec. 11, 1981

[30] Foreign Application Priority Data

Dec. 26, 1980 [JP] Japan .................................. 55-188936

[51] Int. Cl.³ ............................................. H03K 5/22
[52] U.S. Cl. .................................... 307/362; 307/264; 307/359; 307/297
[58] Field of Search .............. 307/264, 362, 359, 297; 330/257, 259

[56] References Cited

U.S. PATENT DOCUMENTS 3,673,508  6/1972  Callahan, Jr. ........................ 330/257
4,114,149  9/1978  Kendall ................................. 307/362
4,263,562  4/1981  Seiler ..................................... 330/257
4,358,752 11/1982  Tamada et al. ....................... 307/362

*Primary Examiner*—John Zazworsky
*Attorney, Agent, or Firm*—Staas & Halsey

[57]  ABSTRACT

A comparator circuit providing a hysteresis characteristic which does not change a hysteresis width even if a power supply voltage changes is disclosed. The comparator circuit comprises a differential amplifier including an input terminal, a reference terminal and an output terminal; an input voltage terminal to which an input voltage is applied; a reference voltage terminal to which a reference voltage is applied; at least one level shift means connected between said input voltage terminal and said input terminal, or between said reference voltage terminal and said reference terminal; a current source means connected to the output of said level shift means; and control means for controlling the current value of said current source means in accordance with the output level of said output terminal.

8 Claims, 7 Drawing Figures

COMPARATOR CIRCUIT

BACKGROUND OF THE INVENTION

1. Field of the Invention

This invention relates to a comparator circuit, particlularly to a comparator circuit providing the hysteresis characteristic which does not change the hysteresis width even if the power supply voltage changes.

2. Description of the Prior Art

In case of configurating a comparator circuit with an IC and giving the hysteresis characteristic to said comparator circuit, the hysteresis width is determined ordinarily with power supply voltage and resistance ratio. In addition, in the case of an integrated circuit which can set from outside the power supply current and bias current such as a low power integrated circuit, such hysteresis width is determined by said current or internal resistance. The power supply voltage is comparatively constant but in some cases changes considerably.

FIG. 1 shows the structure of existing ordinary comparator circuit. In FIG. 1, 10 is the high gain differential amplifier having the input terminal (positive side) 1, reference terminal 2 (negative side) and output terminal 3, and its input terminal 1 is connected to the input voltage terminal 4, while the reference terminal 2 to the reference voltage terminal 5. To the input voltage terminal 4, an input voltage $V_i$ is applied while to the reference voltage terminal 5, the reference voltage $V_r$ is applied. When $V_i(1) < V_r(2)$; where $V_i(1)$ is an input voltage at the input terminal 1 and $V_r(2)$ is the reference voltage at the reference terminal 2, the differential amplifier 10 outputs an output voltage $V_0$ of L (low) level to the output terminal 3, and when $V_i(1) > V_r(2)$, and output voltage $V_0$ of H (high) level.

The proportional operation area is distributed in the vicinity, where $V_i(1) = V_r(2)$ but when the gain is high, such operation area is very narrow and $V_0$ is considered to change in the form of step when $V_i(1) = V_r(2)$ as shown in FIG. 2.

When an output voltage $V_0$ is fed back to the input terminal 1 of such differential amplifier 10 via the resistor 12 ($R_f$), the hysteresis characteristic having the width W is obtained as shown in FIG. 2. In FIG. 1, the input voltage terminal 4 to which an input voltage $V_i$ is applied has an input resistance $R_{in}(R_{in} < R_f)$ but it is omitted in the drawing.

In FIG. 1, if an output voltage $V_0$ becomes H (high) level, for example, an input voltage $V_i(1)$ is boosted by such H level. Therefore, $V_0$ does not become L (low), because the relation $V_i(1) < V_r(2)$ is not established if an input voltage $V_i(4)$ is not lowered by that as much as boosted or more. In addition, when an output voltage $V_0$ changes to H from L, an output voltage $V_0$ becomes H only when an input voltage $V_i(1)$ is lowered by means of the feedback resistance 12 and resultingly $V_i(4)$ becomes higher than that when the feedback resistance 12 is not used.

The hysteresis width W of the comparator circuit having such hysteresis characteristic is influenced by the power supply voltage $V_{cc}$. Namely, the H level output voltage $V_0$ is determined by the power supply voltage $V_{cc}$ and becomes small when the power supply voltage is lowered. Therefore, the circuit shown in FIG. 1 has a disadvantage that a value of input voltage $V_i(4)$ which changes from H level to L or from L level to H and resultingly the hysteresis width W also changes.

SUMMARY OF THE INVENTION

It is an object of the present invention to provide a comparator circuit which does not allow the hysteresis width to change due to a change of power supply voltage.

It is another object of the present invention to provide a comparator circuit which is capable of sustaining a constant hysteresis width without requiring a change of constant of external elements even when the power supply voltage or power source current is changed in the range of several times of rated value.

These objects are attained, according to the present invention, by providing
a comparator circuit comprising:
a differential amplifier including an input terminal, a reference terminal and an output terminal;
an input voltage terminal to which an input voltage is applied;
a reference voltage terminal to which a reference voltage is applied;
at least one level shift means connected between said input voltage terminal and said input terminal, or between said reference voltage terminal and said reference terminal;
a current source means connected to the output of said level shift means;
control means for controlling the current value of said current source means in accordance with the output level of said output terminal.

DETAILED DESCRIPTION OF THE INVENTION

Figure 1:
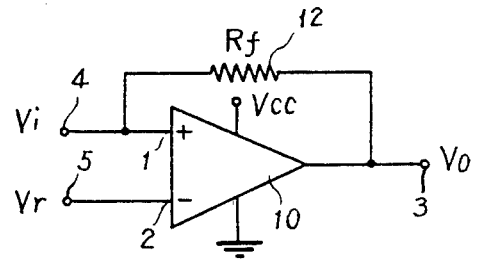
FIG. 1 shows the structure of existing comparator circuit.
Figure 2:
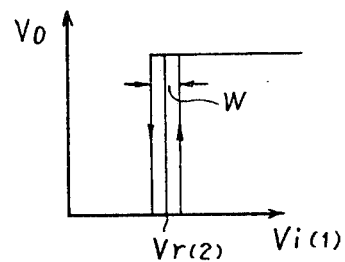
FIG. 2 shows the hysteresis characteristic of the circuit shown in FIG. 1.
Figure 3:
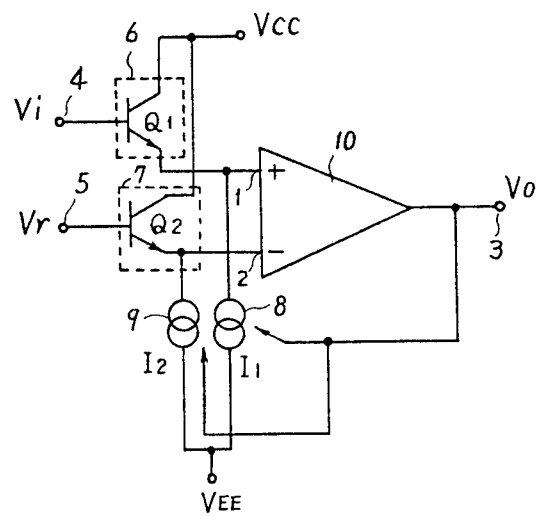
FIG. 3 shows the structure of comparator circuit according to an embodiment of the present invention.

FIG. 3 shows the structure of a comparator circuit according to an embodiment of the present invention. In FIG. 3, the same portions as those in FIG. 1 are given the same numbering. In the circuit of FIG. 3, a level shift means 6 consisting of the base-emitter of transistor $Q_1$ is provided between the input terminal 1 and input voltage terminal 4 of differential amplifier 10, and a level shift means 7 consisting of the base-emitter of transistor $Q_2$ is provided between the reference terminal 2 and reference voltage terminal 5 of differential amplifier 10. $V_{cc}$, $V_{EE}$ are respectively the high and low voltage power supplies.

The emitter follower type transistors $Q_1$, $Q_2$ are driven by a constant current by the current sources 8, 9 so that an input current can be ignored. These currents $I_1$, $I_2$ are given by the following equations.

$$I_1 \approx I_s e^{q/KT \cdot V_{BE1}} \quad (1)$$

$$I_2 \approx I_s e^{q/KT \cdot V_{BE2}} \quad (2)$$

Here, $I_s$ is the saturation current, q is the change of electron, k is the Boltzman's constant, T is the absolute temperatures, $V_{BE1}$, $V_{BE2}$ are the base emitter voltage of transistors $Q_1$, $Q_2$.

From the equations (1) and (2), $$V_{BE1} = KT/q \ln I_1/I_s \quad (3)$$

$$V_{BE2} = KT/q \ln I_2/I_s \quad (4)$$

Therefore, $$V_{BE2} - V_{BE1} = KT/q \ln I_2/I_1 \quad (5)$$

From the above equation, when $I_1 = I_2$, $V_{BE1} = V_{BE2}$, and when $I_2 = 2I_1$, $V_{BE2} - V_{BE1} = (kT/q)\ln 2 \approx 20(mV)$. In the case of this circuit, the current source 9 is allowed, for example, to change and the relation $I_2 = I_1$ is obtained when an output voltage $V_0$ is L level or the relation $I_2 = mI_1$ (here m>1) is obtained when it is H level. Thereby, when an output voltage $V_0 = L$ level and $V_{BE}$ which is the same as that in case $I_2 = I_1$ is added to the input voltage $V_i$ and reference voltage $V_r$. Therefore it becomes equal to zero, considering it from the differential amplifier 10, and an output voltage $V_0$ becomes H level when $V_i > V_r$. When an output voltage $V_0$ becomes H level, the current source 9 outputs $mI_1$ and $V_{BE2}$ becomes large as is obvious from the equation (4) (increment is considered as $\Delta V$). Namely, the reference voltage $V_r$ is supposed to be lowered by $\Delta V$ when considered from the differential amplifier 10. Therefore, a voltage being input to the input terminal 1 of the differential amplifier 10 seems to be relatively increased. For this reason, when an output voltage $V_0$ returns to the L level, an input voltage $V_i$ must be lowered by $\Delta V$ than the reference voltage $V_r$ and thereby an output voltage $V_0$ indicates the hysteresis characteristic having the width of $\Delta V$. Moreover, the width $\Delta V$, as is obvious from the equation (5), depends on the physical constants such as k, T, q and a current ratio of $I_2/I_1$, but on the power supply voltage $V_{CC}$. The hysteresis width thus obtained is not influenced by the power supply voltage fluctuation. In the case of integrated circuits, resistance values fluctuate considerably but a current ratio of the constant current source can be set accurately to the desired value. Resultingly, the hysteresis width can be adjusted accurately by changing such current ratio.

Since the hysteresis width is determined by a changed value m of current of the current source 9, when, $m=10$ (at this time, said width is about 60mV), a large hysteresis width can be obtained. In addition, when the current source 8 in the input voltage $V_i$ side is increased in the backward direction together with the current source 9, namely when $I_2$ is increased m times, the hysteresis width is doubled against to that while only one current source is used by changing $I_1$ to $I/m$.

In such a case where only the current source 9 is changed, the level shift means 6 and current source 8 can be omitted. However, in this case, an input voltage $V_i$ is directly applied to the input terminal 1 (without level shift) and therefore when $V_i > V_r - V_{BE2}$, an output voltage $V_o$ turns to the H level from L level.

At any rate, the hysteresis characteristic can be obtained by controlling a constant current value of the current source 8 or 9.

Figure 4:
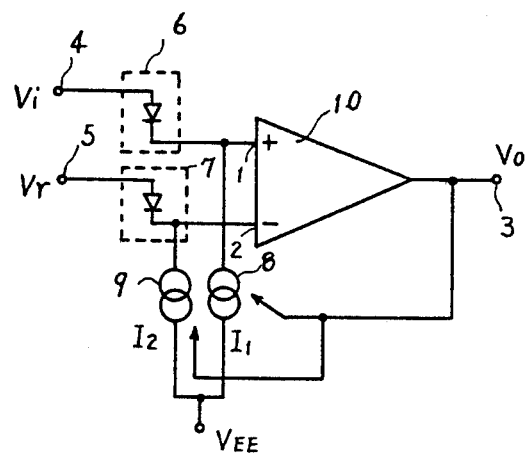
FIG. 4 is the structure of a comparator circuit according to the other embodiment of the present invention.

FIG. 4 shows the structure of a comparator circuit according to another embodiment of the present invention.

In FIG. 4, as the level shift means 6, 7, diodes are used and others are the same as those in FIG. 3.

Figure 5:
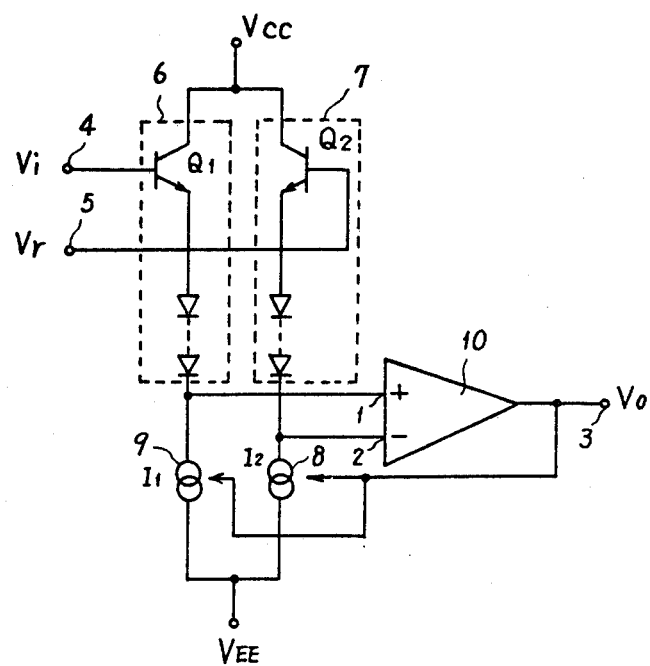
FIG. 5 is the structure of a comparator circuit according to another embodiment of the present invention.

FIG. 5 shows the structure of a comparator circuit according to another embodiment of the present invention.

As shown in FIG. 4, when the level shift means 6, 7 are formed by inserting in series the diodes to the emitter of transistors $Q_1$, $Q_2$, amount of change in the forward voltage of diode is added. Therefore, the range of hysteresis width change due to a change of current value of the current source becomes wide. Namely, when values of constant current source are $I_1$, $I_2$ for the L level output voltage $V_0$ and these are changed respectively to $I_1'$, $I_2'$ for the H level output voltage $V_0$, $$\Delta V = N(kT/q)\ln(I_2/I_1 \cdot I_1'/I_2')$$

when the sum of the transistors and diodes used for level shifts is considered as N for both inputs.

A current value of the constant current source can be done easily, for example, by changing over the two current sources of $I_1$, $mI_1$ prepared with the H and L levels of the output voltage $V_0$.

Figure 6:
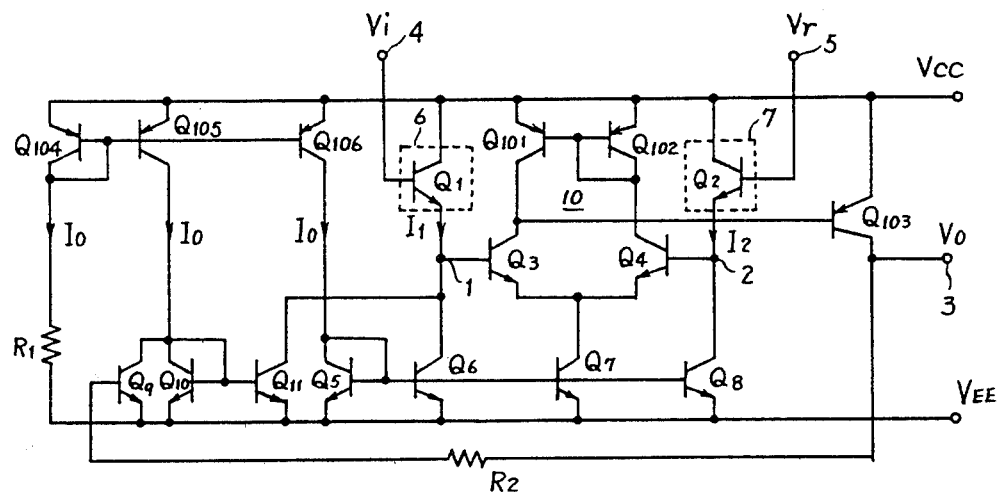
FIG. 6 is an example of the practical circuit corresponding to an embodiment of FIG. 3.

FIG. 6 is an example of the practical circuit corresponding to an embodiment of FIG. 3.

In this figure, the transistors $Q_{101}$ to $Q_{103}$, $Q_3$, $Q_4$ and $Q_7$ correspond to said differential amplifier 10, and $Q_1$, $Q_2$ are input transistors, while $Q_6$, $Q_8$, $Q_{11}$ are current source transistor and these respectively correspond to said level shift means 6, 7 and current sources 8, 9.

The transistors $Q_{104}$ to $Q_{106}$ controls the circuit for generating the bias current $I_0$, while the transistors $Q_5$, $Q_9$, $Q_{10}$ controls the bias current of differential amplifier 10 with said current. In case the output voltage $V_0$ is L level in this case, the transistor $Q_9$ is OFF, and resultingly the bias current $I_1$ of transistor $Q_1$ is two times of $I_0$ and the bias current $I_2$ of transistor $Q_2$ is equal to $I_0$. Therefore, $V_{BE}$ of transistor $Q_1$ and $V_{BE}$ of transistor $Q_2$ are in the following relation:

$$V_{BE1} - V_{BE2} \approx 20 \, mV$$

In addition the base potentials $V_1$, $V_2$ of transistors $Q_3$, $Q_4$ are expressed as follows:

$$V_1 = V_i - V_{BE1}$$

$$V_2 = V_r - V_{BE2}$$

Therefore, a difference of these voltages $V_1$, $V_2$ becomes as follows:

$$V_1 - V_2 = V_i - V_r - (V_{BE1} - V_{BE2})$$

$$= V_i - (V_r + 20 \, mV)$$

When the input voltage $V_i$ changes to H level from L level, the output $V_0$ changes to H level from L level at the point where $V_i = V_r + 20mV$. When the output voltage $V_0$ becomes H level, the transistor $Q_9$ turns ON and $I_1 = I_2 = I_0$. Thus, $V_1 - V_2 = V_i - V_r$. When $V_i$ changes to L level from H level, $V_0$ becomes L level from H level at the point where $V_i=V_r$. Thus, this circuit has the hysteresis width of $\Delta V=20$ mV.

Figure 7:
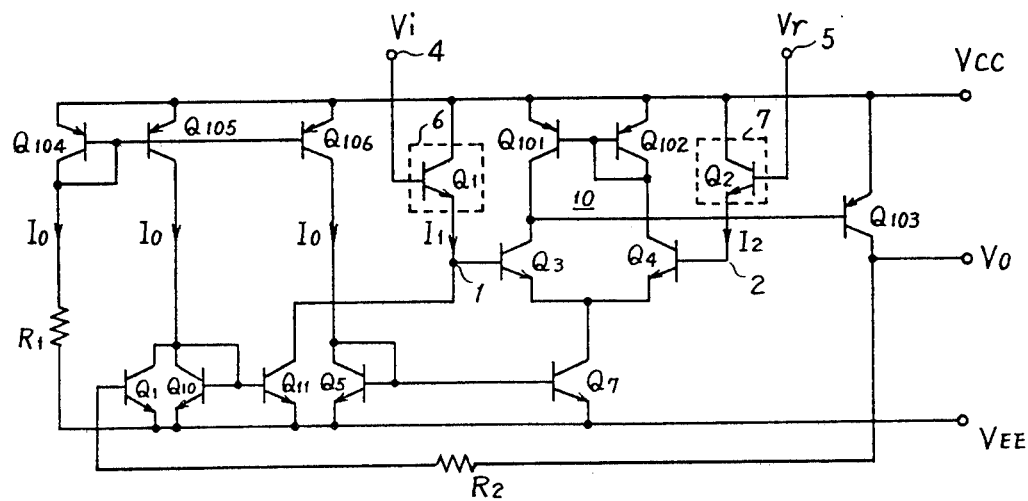
FIG. 7 is another example of practical circuit corresponding to an embodiment of FIG. 3.

FIG. 7 shows another practical example. This circuit is different from FIG. 6 in such a point that the current source transistors $Q_6$, $Q_8$ are omitted. In this circuit, the base current of transistors $Q_3$, $Q_4$ in the next stage is used as the bias current of level shift means 6, 7 and therefore the hysteresis width $\Delta W$ becomes as follows:

$$\Delta W = kT/q \ln ((1/\beta \cdot I_0/2 + I_0)/(1/\beta \cdot I_0/2))$$

$$\approx kT/q \ln (2\beta)$$

$\beta$ is the current amplification coefficient of the NPN transistors $Q_3$, $Q_4$. When $\beta$ changes within the range from 50 to 250, $\Delta W=120$ to 160 mV, resulting in a large hysteresis width. Therefore, the circuit of FIG. 7 is a very effective circuit for a certain purpose.

As explained above, according to the present invention, a comparator circuit having the hysteresis characteristic of the accurate width which is not influenced by fluctuation of power source voltage is obtained by the method that the input voltage $V_i$ and/or the reference voltage $V_r$ is shifted by $V_{BE}$ of transistor and said $V_{BE}$ is changed in accordance with the output level of the comparator circuit.

While the invention has been shown and described with respect to the preferred embodiment thereof, it will be understood by those skilled in the art that various changes in form and detail may be made therein without departing from the spirit and scope of the invention.

We claim:

1. A comparator circuit operatively connected to receive input and reference voltages, comprising:
   a differential amplifier including an input terminal, a reference terminal and an output terminal;
   an input voltage terminal to which the input voltage is applied;
   a reference voltage terminal to which the reference voltage is applied;
   first level shift means, operatively connected between said input voltage terminal and said input terminal, for shifting the level of the input voltage;
   first current source means, operatively connected to said first level shift means, for supplying current having a first current value to said first level shift means; and
   control means, operatively connected to said first current source means and said output terminal, for controlling the first current value of said first current source means in accordance with the output level of said output terminal.

2. A comparator circuit as claimed in claim 1, wherein said comparator circuit further comprises second level shift means operatively connected between said reference voltage terminal and said reference terminal,
   wherein said first current source means is operatively connected to said control means and said first level shift means, and
   wherein said comparator circuit further comprises second current source means, operatively connected to said control means and said second level shift means, for supplying current having a second current value to said second level shift means.

3. A comparator circuit as claimed in claim 1, wherein said first level shift means comprises a transistor having a base operatively connected to said input terminal and having an emitter operatively connected to said input terminal.

4. A comparator circuit as claimed in claim 1, wherein said first level shift means comprises a diode having an anode operatively connected to said input voltage terminal and having a cathode operatively connected to said input terminal.

5. A comparator circuit as claimed in claim 1,
   wherein said comparator circuit further comprises second level shift means operatively connected between said input voltage terminal and said input terminal,
   wherein said first current source means is operatively connected to said control means and said first level shift means, and
   wherein said comparator circuit further comprises second current source means, operatively connected to said control means and said second level shift means, for supplying current having a second current value to said second level shift means.

6. A comparator circuit as claimed in claim 1, wherein said first level shift means comprises a transistor having a base operatively connected to said reference voltage terminal and having an emitter operatively connected to said reference terminal.

7. A comparator circuit as claimed in claim 1, wherein said first level shift means comprises a diode having an anode operatively connected to said reference voltage terminal and having a cathode operatively connected to said reference terminal.

8. A comparator circuit operatively connected to receive input and reference voltages, comprising:
   a differential amplifier including an input terminal, a reference terminal and an output terminal;
   an input voltage terminal to which the input voltage is applied;
   a reference voltage terminal to which the reference voltage is applied;
   first level shift means, operatively connected between said reference voltage terminal and said reference terminal, for shifting the level of the reference voltage;
   first current source means, operatively connected to said first level shift means, for supplying current having a first current value to said first level shift means; and
   control means, operatively connected to said first current source means and said output terminal, for controlling the first current value of said first current source means in accordance with the output level of said output terminal.

* * * * *

UNITED STATES PATENT AND TRADEMARK OFFICE
CERTIFICATE OF CORRECTION

PATENT NO. : 4,456,840

DATED : June 26, 1984

INVENTOR(S) : Tetsuo Ide et al.

It is certified that error appears in the above-identified patent and that said Letters Patent is hereby corrected as shown below:

Col. 1, line 8, "clularly" should be --cularly--;
"the" should be --a--;

line 10, "the" should be --a--;

line 12, "In case of" should be --When--;
"with" should be --as--;

line 13, "the" should be --a--;

line 14, delete "the";

line 15, "with" should be --by a--;
after "and" insert --a--;

line 16, "in the case of" should be --for--;
after "circuit" insert --in--;
after "which" insert --the hysteresis--;

line 17, after "from" insert --an--;
delete "the";
change "and" to --or--;

line 19, after "or" insert --an--;

line 20, after "voltage" insert --supplying the current--;

line 22, after "of" insert --an--;

UNITED STATES PATENT AND TRADEMARK OFFICE
CERTIFICATE OF CORRECTION

PATENT NO. : 4,456,840

DATED : June 26, 1984

INVENTOR(S) : Tetsuo Ide et al.

It is certified that error appears in the above-identified patent and that said Letters Patent is hereby corrected as shown below:

Col. 1, line 23, "the" should be --a--;

line 24, delete "the";

line 26, ", and its input" should be --. Input--; delete "the";

line 27, after "2" insert --is connected--; delete "the" (second occurrence);

line 29, after "applied" insert --,--;

line 30, "the" should be --, a--;

line 34, after "of" insert --a--;

line 35, "and" (second occurrence) should be --an--;

1, line 36, after "of" insert --an--; after "level" insert --is output--;

line 37, "The proportional operation" should be --An uncertainty or hysteresis--;

line 38, after "$V_r(2)$" insert --which causes the exact switch point from the high level to the low level to be uncertain,--;

line 39, "operation" should be --uncertainty--;

UNITED STATES PATENT AND TRADEMARK OFFICE
CERTIFICATE OF CORRECTION

PATENT NO. : 4,456,840  
DATED : June 26, 1984  
INVENTOR(S) : Tetsuo Ide et al.

It is certified that error appears in the above-identified patent and that said Letters Patent is hereby corrected as shown below:

Col. 1, line 40, after "step" insert --from the high to the low level or vice versa--;

line 43, "the" should be --a--;

line 47, delete "it";

line 48, "omitted" should be --not shown--;

line 49, "an" should be --the--;
after "becomes" insert --the--;

line 50, "an" should be --the--;
after "$V_i(1)$" insert --, because of the feedback,--;

line 51, after "become" insert --the--;
after "(low)" insert --level--;

line 52, "if" should be --when--;

line 53, "delete "that";
delete "as";

line 54, delete "boosted";
after "more" insert --than it is boosted---;

line 55, "an" should be --the--;

line 56, delete "means";

UNITED STATES PATENT AND TRADEMARK OFFICE
CERTIFICATE OF CORRECTION

PATENT NO. : 4,456,840

DATED : June 26, 1984

INVENTOR(S) : Tetsuo Ide et al.

It is certified that error appears in the above-identified patent and that said Letters Patent is hereby corrected as shown below:

Col. 1, line 57, delete "of";

line 66, after "disadvantage" insert --in--.

Col. 2, line 1, delete "and"; "resultingly" should be --results in--;

line 2, "changes" should be --changing--;

line 7, after "change" insert --in voltage--; after "of" insert --a--;

line 12, delete "constant of";

line 14, delete "the"; "of" should be --a--;

line 16, no new paragraph;

line 17, no new paragraph;

line 19, no new paragraph;

line 21, no new paragraph;

line 27, no new paragraph;

line 29, after "means;" insert --and--; no new paragraph

UNITED STATES PATENT AND TRADEMARK OFFICE
CERTIFICATE OF CORRECTION

PATENT NO. : 4,456,840  Page 5 of 13
DATED : June 26, 1984
INVENTOR(S) : Tetsuo Ide et al.

It is certified that error appears in the above-identified patent and that said Letters Patent is hereby corrected as shown below:

Col. 2, line 36, "shows the structure of" should be --illustrates an--;

line 37, "." should be --;--;

line 38, "shows the" should be --illustrates an--;

line 39, "." should be --;--;

line 40, "shows the structure of" should be --illustrates a--;

line 41, "." should be --;--;

line 42, "is the structure of" should be --illustrates--;

line 43, "the other" should be --another--;

line 44, "." should be --;--;

line 45, "is the structure of" should be --illustrates--;

line 47, "." should be --;--;

line 48, "an example of the pratical" should be --a--;

after "circuit" insert --diagram--;

UNITED STATES PATENT AND TRADEMARK OFFICE
CERTIFICATE OF CORRECTION

PATENT NO. : 4,456,840
DATED : June 26, 1984
INVENTOR(S) : Tetsuo Ide et al.

It is certified that error appears in the above-identified patent and that said Letters Patent is hereby corrected as shown below:

Col. 2, line 49, "." should be --; and--;

line 50, delete "example of practical"; after "circuit" insert --diagram--;

line 51, "to an" should be --the--;

line 52, delete "DETAILED";

line 53, change "INVENTION" to --PREFERRED EMBODIMENTS--;

line 55, "the" should be --a--;

line 59, "consisting of the" should be --comprising a--;
after "-emitter" insert --connection--;

line 62, "consisting of the" should be --comprising a--;
after "-emitter" insert --connection--;

line 65, "$V_{cc}$," should be --$V_{cc}$ and--; delete "the";

line 67, "$Q_1$," should be --$Q_1$ and--;

line 68, "by" (2nd.occurr.) should be --with--; "8," should be --8 and--; "9" should be --9,--.

UNITED STATES PATENT AND TRADEMARK OFFICE
CERTIFICATE OF CORRECTION

PATENT NO. : 4,456,840

DATED : June 26, 1984

INVENTOR(S) : Tetsuo Ide et al.

It is certified that error appears in the above-identified patent and that said Letters Patent is hereby corrected as shown below:

Col. 3, line 2, "$I_1$," should be --$I_1$ and--;

line 8, "Here" should be --Where--;
delete "the" (first occurrence);
"change" should be --charge--;
after "of" insert --an--;

line 9, delete "the" (first and second occurrences);

line 10, after "temperatures," insert --and--;
after "$V_{BE1}$" insert --and--;

line 11, after "$Q_1$," insert --and--;

line 21, "$I_2$," should be --$I_2$ then--;

line 22, "$2I_1$," should be "$2I_1$ then--;

line 23, delete "the case of";

line 25, after "is" insert --the--;

line 26, after "is" (second occurrence) insert --the--;

line 27, "an" should be --the--;
"level and" should be --level,--;

UNITED STATES PATENT AND TRADEMARK OFFICE
CERTIFICATE OF CORRECTION

PATENT NO. : 4,456,840
DATED : June 26, 1984
INVENTOR(S) : Tetsuo Ide et al.

It is certified that error appears in the above-identified patent and that said Letters Patent is hereby corrected as shown below:

Col. 3, line 30, "it" (1st occurr.) should be --$V_{BE}$--; delete "considering it"; after "the" insert --point of view of the--;

line 32, after "comes" insert --the--;

line 33, after "becomes" insert --the--; "$mI_1$" should be --$MI_1$,--;

line 34, delete "the";

line 35, "Namely, the" should be --The--;

line 37, after "the" insert --point of view of the--;

line 41, after "$\Delta V$" insert --more--;

line 43, "indicates" should be --has--;

line 45, delete "the" (first occurrence);

line 46, after "but" insert --not--;

line 52, "Resultingly" should be --As a result--;

line 53, "such" should be --the--;

line 54, delete "changed";

// UNITED STATES PATENT AND TRADEMARK OFFICE
CERTIFICATE OF CORRECTION

PATENT NO. : 4,456,840
DATED : June 26, 1984
INVENTOR(S) : Tetsuo Ide et al.

It is certified that error appears in the above-identified patent and that said Letters Patent is hereby corrected as shown below:

Col. 3, line 55, after "of" (first occurrence) insert --the--;

"when," should be --when--;

line 56, "said" should be --the--;

line 58, "in" (first occurrence) should be --of--; delete "increased in the";

line 59, "backward direction together" should be --decreased as compared--;

line 60, after "times" insert --and $I_1$ is decreased to I/m--;

line 61, "against to that while" should be --as compared to when--;

line 62, delete "by changing $I_1$ to I/m";

line 63, "such a" should be --the--;

line 66, after "without" insert --a--;

Col. 4, line 1, no new paragraph; after "the" insert --desired--;

line 6, no new paragraph;

line 7, "6," should be --6 and--;

UNITED STATES PATENT AND TRADEMARK OFFICE
CERTIFICATE OF CORRECTION

PATENT NO. : 4,456,840

DATED : June 26, 1984

INVENTOR(S) : Tetsuo Ide et al.

It is certified that error appears in the above-identified patent and that said Letters Patent is hereby corrected as shown below:

Col. 4, line 8, after "and" insert --the--; "others" should be --other elements--;

line 11, no new paragraph;

line 12, "4" should be --5--; "6," should be --6 and--;

line 13, delete "the" (first occurrence); after "diodes" insert --connected--;

line 14, "$Q_1$," should be --$Q_1$ and--; after "$Q_2$," insert --the--; after "of" (second occurrence) insert --voltage--;

line 15, after "of" (first occurrence) insert --the--; after "added" insert --to the total--;

line 18, "$I_1$," should be --$I_1$ and--;

line 19, delete "and these";

line 27, "done" should be --charged--; delete "over";

line 28, "$I_1$," should be --$I_1$ and--; "with" should be --for--;

UNITED STATES PATENT AND TRADEMARK OFFICE
CERTIFICATE OF CORRECTION

PATENT NO. : 4,456,840
DATED : June 26, 1984
INVENTOR(S) : Tetsuo Ide et al.

It is certified that error appears in the above-identified patent and that said Letters Patent is hereby corrected as shown below:

Col. 4, line 30, "the practical" should be --a--;

line 31, no new paragraph;

line 33, "$Q_1$," should be --$Q_1$ and--;

line 34, "$Q_8$," should be --$Q_8$ and--;

line 35, "transistor" should be --transistors--;

line 36, "6," should be --6 and--;
"8," should be --8 and--;

line 37, "controls" should be --control--;

line 39, "$Q_9$," should be --$Q_9$ and--;
"controls" should be --control--;

line 40, "In case" should be --When--;
after "is" insert --the--;

line 41, delete "in this case";
delete "result";

line 42, delete "ingly";
delete "of" (second occurrence);

line 45, "are in" should be --have--;
"relation" should be --relationship--;

UNITED STATES PATENT AND TRADEMARK OFFICE
CERTIFICATE OF CORRECTION

PATENT NO. : 4,456,840

DATED : June 26, 1984

INVENTOR(S) : Tetsuo Ide et al.

It is certified that error appears in the above-identified patent and that said Letters Patent is hereby corrected as shown below:

Col. 4, line 49, "$V_1$," should be --$V_1$ and--;

line 50, "$Q_3$," should be --$Q_3$ and--;

line 56, "$V_1$," should be --$V_1$ and--;

line 63, after "to" insert --the--;
after "from" insert --the--;

line 64, after "to" insert --the--;
after "from" insert --the--;

line 66, after "becomes" insert --the--;

line 67, after "to" insert --the--;

line 68, after "from" (first occurrence) insert --the--;
after "becomes" insert --the--.

Col. 5, line 4, delete "in" and insert --,--;
delete "a point";

line 5, "$Q_6$," should be --$Q_6$ and--;

line 6, "$Q_3$," should be --$Q_3$ and--;

line 7, after "of" insert --the--;
"6," should be --6 and--;

UNITED STATES PATENT AND TRADEMARK OFFICE
CERTIFICATE OF CORRECTION

PATENT NO. : 4,456,840  Page 13 of 13

DATED : June 26, 1984

INVENTOR(S) : Tetsuo Ide et al.

It is certified that error appears in the above-identified patent and that said Letters Patent is hereby corrected as shown below:

Col. 5, line 16, "$\beta$" should be --where $\beta$--;

line 17, "$Q_3$," should be --$Q_3$ and--;

line 20, "a certain" should be --the desired--;

line 23, "the" should be --an--;

line 24, "the" should be --a--;

line 25, "that" should be --where--;

line 26, after "of" insert --a--; delete "said".

Signed and Sealed this

Fifth Day of November 1985

[SEAL]

Attest:

DONALD J. QUIGG

Attesting Officer

Commissioner of Patents and Trademarks